United States Patent [19]
Ehnholm

[11] Patent Number: 5,184,076
[45] Date of Patent: Feb. 2, 1993

[54] MAGNETIC RESONANCE IMAGING COIL FOR APPLYING NMR AND ESR PULSES

[75] Inventor: Gosta J. Ehnholm, Helsinki, Finland

[73] Assignee: Instrumentarium Corporation, Helsinki, Finland

[21] Appl. No.: 680,574

[22] Filed: Apr. 4, 1991

[30] Foreign Application Priority Data

Apr. 4, 1990 [GB] United Kingdom ............ 9007636

[51] Int. Cl.$^5$ .................................. G01R 33/20
[52] U.S. Cl. ........................... 324/318; 324/316
[58] Field of Search ............ 324/300, 307, 309, 310, 324/311, 313, 314, 316, 317, 318, 322; 128/653.5

[56] References Cited

U.S. PATENT DOCUMENTS

| | | | |
|---|---|---|---|
| 4,719,425 | 1/1988 | Ettinger | 324/316 |
| 4,891,593 | 1/1990 | Lurie et al. | 324/300 |
| 4,984,573 | 1/1991 | Leunbach | 324/309 |
| 5,111,145 | 5/1992 | Sepponen | 324/316 |

FOREIGN PATENT DOCUMENTS

0296833 6/1988 United Kingdom .

OTHER PUBLICATIONS

Lauterbur Nature 242:190–191 (1973).
Steinberg A. J. R. 147:453–455 (1986).
Steiner A. J. R. 145:893 (1985).
Bottomley; Rev. Sci. Instrum. 53:1319–1337 (1982).
Hinshaw et al; Proc. IEEE 71:338–350 (1983).
House; IEEE Trans. Nuc. Sci. NS-27:1220–1226 (1980).
Koutcher et al; J. Nucl. Med. 25:371–382 (1984).
Pykett; Radiology 143:157–168 (1982).
Twieg; Med. Phys. 10:610–621 (1983).
Lurie et al; J. Magn. Reson. 76:360–370 (1988).
Sepisnik et al; Soc. Mag. Res. in Med. 7th Annual meeting; 20–26 Aug. 1988:1060.

Primary Examiner—Michael J. Tokar
Assistant Examiner—Raymond Y. Mah
Attorney, Agent, or Firm—Chilton, Alix & Van Kirk

[57] ABSTRACT

A magnetic resonance imaging apparatus comprising device for applying a magnetic field to a sample to be imaged, device for applying pulses of MR transition-exciting electromagnetic radiation to the sample, an NMR signal coil for detecting the resulting radiation from the sample, and device for appling pulses of electromagnetic radiation to the sample for stimulating coupled ESR transitions, in which a pulse generating device is coupled to the NMR signal coil and antennas are coupled to the coil and disposed at plural positions along the coil, whereby pulses for stimulating coupled ESR transitions may be transmitted from the pulse generating device through the coil to the antennas and thence into the sample, the antennas being arranged to give a predominantly magnetic coupling to the sample.

15 Claims, 2 Drawing Sheets

MAGNETIC RESONANCE IMAGING COIL FOR APPLYING NMR AND ESR PULSES

The present invention relates to improvements in methods of magnetic resonance imaging and apparatus therefor.

Magnetic resonance imaging (MRI) is a non-invasive imaging technique which is achieving progressively wider acceptance by physicians for use in medical diagnoses. The technique was developed by Lauterbur who published the first magnetic resonance (MR) images in 1973. By 1985, at least 500 MR imagers had been installed for clinical use around the world (see for example Lauterbur, Nature 242: 190–191 (1973), Steinberg, A.J.R. 147: 453–454 (1986) and Steiner, A.J.R. 145: 883–893 (1985)).

MR images are generated by manipulation of the MR signals detected from a sample, for example a human or animal body, placed in a magnetic field and exposed to pulses of radiation, typically radio frequency (RF) radiation, of a frequency selected to excite MR transitions in selected non-zero spin nuclei (the "imaging nuclei") in the sample.

In order to encode spatial information into the MR signals during the imaging procedure, the magnetic field experienced by the sample is modified by the imposition onto a primary uniform magnetic field $B_o$ of the magnetic field gradients. Thus, for example, since the resonating frequency of an imaging nucleus is dependent on the strength of the magnetic field (B) in which it lies as well of course as on factors such as the chemical environment and the isotopic nature of the nucleus (which may for example be $^1H$, $^{13}C$, $^{19}F$), by imposing a field gradient in the z direction on the sample during periods during which the sample is exposed to pulses of the MR transition-exciting radiation, the position and width in the z direction of the slice through the sample in the xy plane from which the MR signals are emitted is defined by the strength of the primary field $B_o$, the applied field gradient $dB/dz$, and the frequency and bandwidth of the exciting pulses.

Subsequent imposition of further field gradients in the period between the initial pulse of the MR transition-exciting radiation and the period during which the MR signal is detected and also during that period of detection can similarly encode x and y spatial information into the MR signal.

There are several different encoding techniques known in the art, but all rely upon the imposition onto the primary field of field gradients of different magnitudes and/or in different directions, in particular sequences within the MR-transition-excitation/MR-signal-detection cycles.

Moreover, using different pulse and detection sequences, for example spin echo, spin inversion, spin recovery, etc., different types of MR images can be generated from the detected signals, for example images in which the pixel intensity is proportional to the density of the imaging nuclei in the corresponding volume element of the sample (e.g. proton density images), $T_1$ and $T_2$ images.

For a general discussion of the principles of MRI, the reader is referred to the articles by Bottomley, Rev. Sci. Instrum. 53: 1319–1337 (1982), Hinshaw et al, Proc. IEEE 71: 338–350 (1983), House, IEEE Trans. Nucl. Sci. NS-27: 1220–1226 (1980), Koutcher et al J. Nucl. Med. 25: 371–382 (1984), Mansfield et al in "Advances in Magnetic Resonance" edited by Waugh, Academic Press, New York (1982), Pykett, Sci. Am. 246: 54–64 (1982), Twieg, Med. Phys. 10: 610–621 (1983) and Kean et al "Magnetic Resonance Imaging", Heinemann, London (1986).

In an MR imager, the primary magnetic field $B_o$ is conventionally generated by a superconducting magnet, a resistive magnet or a permanent magnet. The choice of the primary magnetic field strength used in MRI affects the quality and characteristics of the images that can be generated and also affects the image acquisition time and the manufacturing and running costs of the MR imager. Thus, for example, for a given image acquisiton procedure, the use of higher strength primary fields results in improved signal to noise (S/N) ratios. As a result, the best MR images that have so far been obtained have been produced using the large primary magnetic fields that can be generated by superconducting magnets. This is because such magnets give very strong, stable and homogeneous fields while at the same time providing some shielding against external perturbing magnetic fields. The disadvantages, however, are that such magnets are very expensive and are very difficult to service and maintain and also that it is now recognized that there are dangers associated with the use of high fields.

At lower fields, for example 2000 gauss, resistive magnets may be used, and at fields of 200 gauss or less such magnets are quite inexpensive and simple to operate and install. At low fields, however, technical problems arise, in particular the poor S/N ratio which results from the low MR signal amplitude and frequency.

This technical problem has been addressed in a variety of ways. Thus, for example Hafslund Nycomed in PCT/GB88/00479 (published as WO-A-88/10419) and Lurie et al in J. Magn. Reson. 76: 360–370 (1988) have described the use of dynamic polarization, produced by stimulation of coupled ESR (electron spin resonance) transitions to increase signal strength, and Stepisnik et al in Society of Magnetic Resonance in Medicine, Seventh Annual Meeting, 20–26 August 1988, page 1060, have suggested that polarization may be enhanced by pulsing the imaging nuclei with a higher magnetic field prior to detection of the MR signals. It is also possible to increase the S/N ratio by decreasing the noise of the MR signal detector, the RF receiver coil, by cooling it with liquid nitrogen and/or by making it of a superconductive material.

This invention relates to improvements in methods relating to said use of dynamic polarization, also referred to as the Overhauser effect. Overhauser effect magnetic resonance imaging, or ESR enhanced MRI, uses ESR to enhance the nuclear polarization, and thus the image signal strength. The enhancement factor E can be quite big, up to several hundred. During the scan the patient to be imaged is, for instance, injected with the paramagnetic agent used for the Overhauser effect and as an end result an image is obtained in which the regions affected by the agent are highlighted.

The advantages of ESR enhanced MRI are thus a greatly improved signal-to-noise ratio and good outlining or contrast of the enhancement medium. The method needs, however, in addition to the equipment used for ordinary MRI, means for stimulating the ESR.

The range of ESR frequencies of interest in ESR enhanced MRI is typically in the range of hundreds of megahertz, often designated as the VHF region, though UHF to a few gigahertz might be used in special cases.

Corresponding wavelengths inside the human body are typically 3–30 cm., which is comparable to or shorter than the region of interest to be imaged. The wave nature of the VHF signal thus has to be taken into account when designing the means for applying it. Said means we will henceforth call "applicator", conforming with the terminology in hyperthermia, where similar problems arise (hyperthermia is a method whereby selective heating is applied to the human body for therapy, for instance using electromagnetic radiation). Alternatively we use the word "antenna".

Combining the VHF applicator with the means used for receiving the nuclear resonance signal poses some practical problems. The NMR-signal from the imaged region is picked up with a coil which should be as close as possible to the imaged region or good signal-to-noise ratio, thus ensuring a good quality image. This makes it difficult to apply the VHF field because it is difficult to design good VHF applicators that take a small enough space. The present invention shows how this problem can be solved.

A good VHF applicator (or antenna) should satisfy the following requirements:

It should give an even field distribution in the region of interest and not produce any "hot spots", i.e., local spots with high values of the electric field vector which causes heating of the tissues. This is very important.

It should give a circularly polarized field in the sense (i.e., right handed or left handed) of the precessing electron spins to minimize rf heating effects. Linearly polarized fields contain a circulating polarization component in the opposite sense which gives extra heat without any ESR effect.

It should have a good efficiency, meaning that most of the VHF power should pass into the patient to be imaged rather than be dissipated in the antenna itself.

It should not affect the coupling of the rf coil to the patient or quality factor (Q-value) adversely.

In order to fulfill the first criterion the VHF antenna should produce an evenly distributed field without strong local variations. The antenna arrangement should therefore be homogeneously distributed around the area to be imaged. The frequencies involved are, however, such that the wavelengths in the antennas tend to be somewhat short compared to the total VHF applicator system. As a consequence we have to use some sort of antenna array, consisting of many elements. The advantage of this is that it gives a lot of flexibility as we can choose the amplitude and phase fed to each element separately, thus engineering a wide variety of field profiles, even to the extent of some degree of focusing it. The drawback is that each antenna element has to be separately fed and this requires a multiplicity of feed lines which tend to decrease the Q-value of the nearby NMR-signal rf coil.

The present invention is to arrange the VHF feed through the NMR-coil wire, which is given the double role of forming a conductor for the rf current and transmission line for the VHF-signal.

Thus according to the invention we provide a method of magnetic resonance imaging using dynamic polarization, comprising applying a magnetic field to a sample to be imaged, applying pulses of MR transition exciting electromagnetic radiation to the sample, applying pulses of electromagnetic radiation to the sample for stimulating coupled ESR transitions and detecting the resulting radiation from the sample with an NMR-signal coil, characterized by applying the ESR pulses with feed lines passing through the NMR-signal coil conductor to radiating elements or antennas arranged to give a predominantly magnetic coupling to said sample.

Viewed from another aspect, the invention provides magnetic resonance imaging apparatus comprising means for applying a magnetic field to a sample to be imaged, means for applying pulses of MR transition-exciting electromagnetic radiation to the sample, an NMR signal coil for detecting the resulting radiation from the sample, and means for applying pulses of electromagnetic radiation to the sample for stimulating coupled ESR transitions, characterized in that a pulse generating means is coupled to the NMR signal coil and antenna means is coupled to the coil and disposed at plural positions along the coil, whereby pulses for stimulating coupled ESR transitions may be transmitted from the pulse generating means through the coil to the antenna means and thence into the sample.

Preferably the antenna means comprises a plurality of discrete antennas coupled to the coil at different positions along its length. The coil is preferably formed of a coaxial cable with the pulse generating means connected between the inner and outer conductors. Alternatively it can be made of two or more coaxial cables with their outer shields joined together, thus forming parallel paths for ESR signals with different phases and/or amplitude. The individual antennas may be capacitively coupled to the coil, for example using capacitor diodes, or they may be inductively coupled. A preferred coupling arrangement is to couple the antennas to a coaxial cable through respective holes in the outer conductor. The antennas may comprise lengths of conductor connected to the cable outer at each end via respective capacitors. The antennas are preferably disposed at intervals along the cable equal to the wavelength of the ESR transition stimulating radiation in the cable, and the holes in the outer conductor may increase in size at increasing distances from the pulse generating means to compensate for attenuation of the signal in the cable. In these ways the outputs of the individual antennas can be made to be in phase and of even intensity.

In another preferred form of the invention adjacent turns of the coil are connected together by capacitors so that sections of the outer conductor form loop antennas which are capacitively or inductively coupled to the coil.

In addition to any of the above arrangements, parasitic antennas may be provided which receive their energy from other antennas.

The patent of Ettinger (U.S. Pat. No. 4,719,425) mentions a similar kind of arrangment in claim 11 and its subclaims 14 and 15. Claim 11 identifies the rf resonance coil with the VHF radiating structure and claims 14 and 15 give two examples of how this could be implemented. Claim 14 states that the rf coil is saddle shaped and used as a distributed transmission line and resonator. The text does not show how this is meant to work, especially what kind of resonance modes are intended and how they are to be fed. Judging from the frequency mentioned in the text (839 MHz), corresponding to about 35 cm. wavelength, some kind of wave-guide or birdcage type of resonances might be implied. There is no indication that the VHF feed lines are arranged to be inside the RF coil conductors. The information given on how much an arrangement is to be built is missing. Claim 13 claims the use of slotted transmission lines as VHF radiators and claim 15 defines a combination of a helical RF coil with a slotted radiator. In this kind of an arrangement the radiating slots could be fed through the RF coil conductor. Although this is not explicitly stated, it would seem to be implied.

Whatever the way the slots are fed, such an arrangement is, however, totally impractical for the following reasons: The slots in such an arrangement can be either perpendicular to or along the RF conductor. The first case is impractical because it would break the path of the RF current, i.e. destroy the RF coil. The second case, with slots along the conductor, produces a predominantly electrical coupling to the region outside the RF conductor, with an electric near-field around the conductor which is very strong. It can be shown that the electric field produced by a slot in a cylinder with a diameter small compared to the wavelength is of the same shape as the magnetic field produced by a current along a cylinder, i.e., the field lines form circles around the cylinder and the field maxima have the strength $E = U\exp(-jkr)/(2\pi r)$, where U is the voltage across the slots, k the wave-number of the radiation and r the distance from the axis of the cylinder. We thus get severe hot spots at the slots, which make it impossible to bring such an arrangement close to the patient. This removes the advantage of integrating the VHF radiator with the rf coil, namely to obtain good coupling of both RF and VHF signals at the same time.

In the present invention we combine the RF coil with the feed lines for special VHF antennas, which are optimized for giving magnetic coupling to the imaging volume, i.e., for a small electric near-field. This combination is essential for obtaining simultaneously a high level of VHF magnetic field intensity, i.e., a high degree of dynamic polarization, while avoiding high local electric fields (hot spots).

Certain embodiments of the invention will now be described by way of example and with reference to the accompanying drawings, in which.

Figure 1:
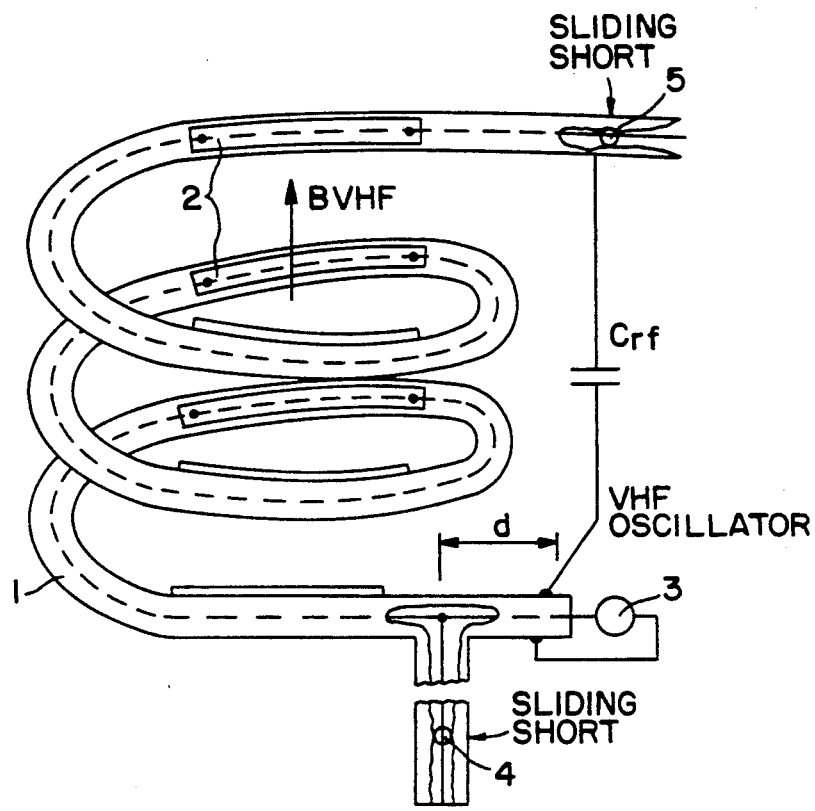
FIG. 1 is a schematic view of an NMR coil and VHF applicator according to the invention.

As an example for an embodiment of the invention we refer to FIG. 1. The figure shows a simple NMR-coil 1 in the shape of a helix or solenoid which is wound of coaxial cable, preferably with a copper tube as outer conductor. The NMR rf current flows on the outer surface of the cable which forms a conventional solenoid that could be used for instance for imaging the knee in a system employing a vertical direction for the $B_o$ field. Individual VHF loop antennas 2 are provided along the coil and the transmission line is impedance matched to the antennas 2 and the VHF oscillator 3 by sliding shorts 4 and 5 in the ends.

Figure 2:
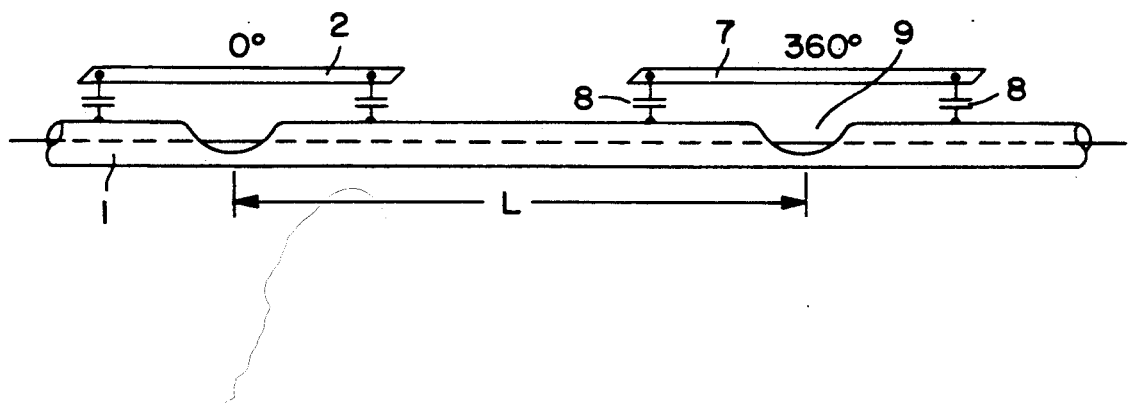
FIG. 2 is a detailed view of two of the individual VHF antennas of FIG. 1.

FIG. 2 shows two of the individual loop antennas fed by the transmission line. They consist of lengths of conductor connected to the outer of the cable 1 by capacitors 8. The antennas couple inductively to the VHF magnetic field in the line through openings 9 cut in the line. They are situated at distance L to each other. For this system L equals the wavelength of the VHF signal in the transmission line so as to have the same phase. As a result the VHF field of all antennas sum.

Figure 3:
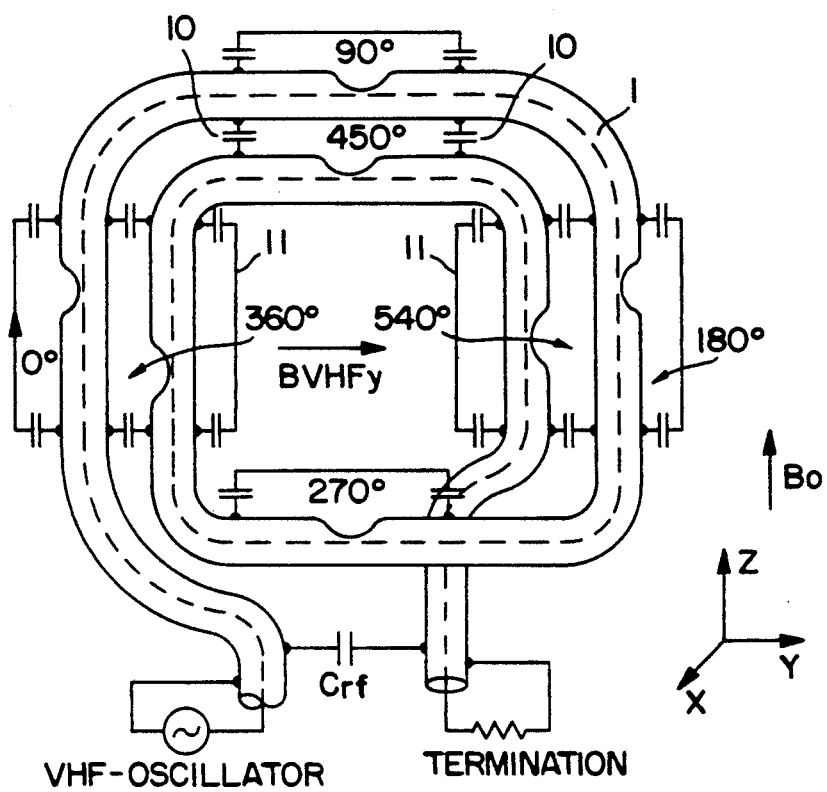
FIG. 3 is a schematic view of an alternative coil suitable, for example, for imaging a part of the spine.

Another preferred arrangement is shown in FIG. 3. This coil system is suitable for instance for imaging a part of the spine. The coaxial cable forms a pancake coil for the rf field. The VHF antennas operate at the different signal phases indicated in the figure. The VHF field forms two components, $B_{VHFy}$, and $B_{BHFx}$ (perpendicular to the paper), with phases 90° with respect to each other, i.e., a circulating VHF field is produced. The antenna elements are partly made according to FIG. 2, partly they are formed by the gap between the coaxial cable turns by adding capacitors 10 between adjacent turns according to FIG. 3. Additional parasitic antennas 11 can be added, two are shown in the middle of the coil. They get their signal power via coupling to the other antennas.

The transmission line is terminated to avoid reflections which would interfere with the proper signal phases at the different feed points. The coupling openings in the transmission line are made bigger towards the line termination to compensate for the decrease in the signal power as going from oscillator towards termination. The signal phase at each opening is indicated in the figure. The phase can be fine adjusted by drilling holes in the outer conductor and connecting a capacitor between inner and outer conductor. This is best done equidistantly between the coupling holes.

An important difference between the arrangements shown in FIG. 1 and FIG. 3 is that the latter generates a VHF field which, at least in part of the imaging volume, is circulating, which is an advantage. The former arrangement, on the other hand, has the advantage that the transmission line can be used as a convenient impedance matching device between the oscillator and the antenna elements. This matching is performed by setting up a standing wave in the transmission line. The phase of the standing wave is adjusted using the two sliding shorts to match the line to the antenna elements. The VHF oscillator is matched to the line by adjusting the distance d. Alternatively both matching functions can be performed with LC-circuits containing capacitor diodes which are easier to adjust.

Yet another preferred arrangement is to take two VHF transmission lines and shape them into a double helix or spiral. At the rf frequency they are coupled together, in series or parallel or a combination of the two, to detect the NMR signal. At the VHF frequency one helix (or spiral) is excited from an oscillator with a first standing wave and the second helix (or spiral) with a second standing wave with a different signal phase, preferably about 90° vis-a-vis the first standing wave. A circulating VHF field can then be produced by having one set of antenna elements coupled to the said first transmission line, and a second set of antenna elements coupled to the said second transmission line. The distance between antenna elements in each case is an even multiple of VHF half-waves in the transmission lines. With this arrangement the advantages of circulating field and impedance matching can be combined.

The shown shape of the antenna elements is just one example; other shapes can be used such as small dipoles and so on. Also the coupling between the VHF transmission line and the antenna elements can be made in many ways and it can be either inductive capacitive or a combination thereof.

If capacitance diodes are used the coupling can be conveniently optimized. Such diodes can also be used as one (or more) of the tuning capacitors in the antenna element itself to facilitate the tuning of the antenna elements, either individually or in groups. This makes it possible to vary the phase of the elements. Combined with coupling diodes it makes it possible to adjust both phase and amplitude of the elements whereby one can focus the VHF field to the region of interest and also compensate for changes in the field profile caused by losses in the object to be imaged.

Such focusing, albeit differently implemented, is demonstrated in apparatuses for hyperthermia treatment. It can advantageously be used even without combining the feed arrangement with the rf coil.

Figure 4:
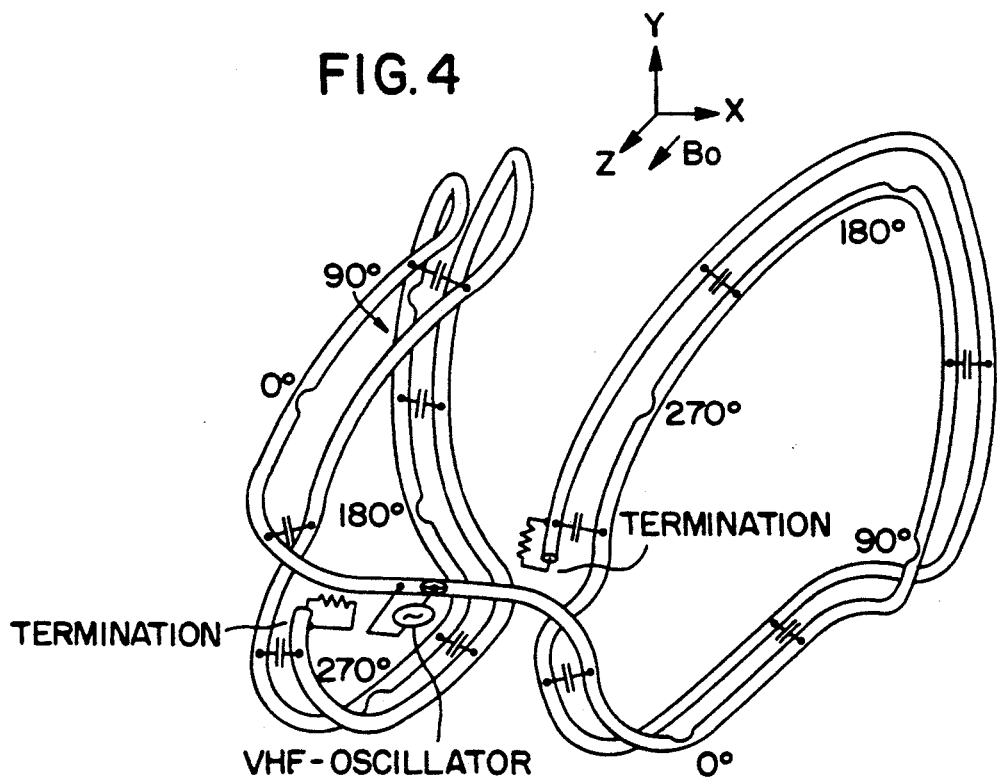
FIG. 4 is a schematic view of yet another coil suitable, for example, for imaging the head.

A yet another example of a preferred arrangement is shown in FIG. 4., which can be used for imaging the head. The transmission line is drawn with four loops forming the NMR rf coil whose tuning capacitor is connected to the outer conductor between the two points marked "Termination". The VHF oscillator is connected in principle as shown, in practice a power divider can be employed at the point of connection to the transmission line. The VHF signal divides into two flowing towards the terminations. It is coupled to antenna elements, eight altogether, through holes in the transmission line. The signal phase at each hole is shown in the figure. The antenna elements are formed by the space between the transmission lines and the shown capacitors, with some of the capacitors being shared between two antenna elements. This arrangement produces a helical rotating VHF field. Said field is approximately in the XY-plane direction and at any moment of time it varies as a function of Z so as to make an approximately 90° turn when going from one end of the array to the other one, i.e., it has the shape of a quarter turn helix.

For clarity FIG. 4 is drawn with only a few turns in the rf coil, in fact more turns might be desirable. Also the number of antenna elements could be increased. In the figure up to eight elements of the type shown in FIG. 2 could be added. In addition another eight parasitic antennas could be added so that each coaxial cable would have antennas on two sides, making 24 antenna elements altogether.

The system could, furthermore, be made into a focusing one by connecting several VHF sources with independently variable amplitudes and phases. For instance four independent VHF sources could be used by, firstly, feeding the cables going to the left and to the right from the indicated feed point from two independent sources and, secondly, by making the rf coil a double helix, thus enabling the use of two additional VHF sources. By grouping the antenna elements connected to each generator into localized clusters, e.g., upper left, lower right, focusing can be shifted by manipulating the phase and amplitude of the four VHF channels.

What is claimed is:

1. A method of magnetic resonance imaging using dynamic polarization, comprising applying a magnetic field to a sample to be imaged, applying pulses of MR transition exciting electromagnetic radiation to the sample, applying pulses of electromagnetic radiation for stimulating coupled ESR transitions and detecting the resulting radiation from the sample with an NMR signal coil, characterized by applying the ESR pulses with feed lines passing through the NMR signal coil conductor to antennas arranged to give a predominantly magnetic coupling to said sample.

2. Magnetic resonance imaging apparatus comprising means for applying a magnetic field to a sample to be imaged, means for applying pulses of MR transition-exciting electromagnetic radiation to the sample, an NMR signal coil for detecting the resulting radiation from the sample, and means for applying pulses of electromagnetic radiation to the sample for stimulating coupled ESR transitions, characterized in that a pulse generating means is coupled to the NMR signal coil and antenna means is coupled to the coil and disposed at plural positions along the coil, whereby pulses for stimulating coupled ESR transitions may be transmitted from the pulse generating means through the coil to the antenna means and thence into the sample.

3. Apparatus as claimed in claim 2 wherein said antenna means comprises a plurality of discrete antennas coupled to the coil at different positions along its length.

4. Apparatus as claimed in claim 2 wherein the coil is formed of a coaxial cable with the pulse generating means connected between the inner and outer conductors.

5. Apparatus as claimed in claim 2 wherein the coil comprises two or more coaxial cables with their outer shields joined together, thus forming parallel paths for ESR signals with different phases.

6. Apparatus as claimed in claim 2 wherein the antenna means is capacitively coupled to the coil.

7. Apparatus as claimed in claim 6 wherein the antenna means is coupled to the coil by capacitor diodes.

8. Apparatus as claimed in claim 2 wherein the antenna means is inductively coupled to the coil.

9. Apparatus as claimed in claim 2 wherein the antenna means is coupled to a coaxial cable through respective holes in the outer conductor thereof.

10. Apparatus as claimed in claim 9 wherein the holes in the outer conductor increase in size at increasing distances from the pulse generating means to compensate for attenuation of the signal in the cable.

11. Apparatus as claimed in claim 2 wherein the antenna means comprise lengths of conductor connected to a coaxial cable outer at each end via respective capacitors.

12. Apparatus as claimed in claim 11 wherein the antenna means is disposed at intervals along the cable equal to the wavelength of the ESR transition stimulating radiation in the cable.

13. Apparatus as claimed in claim 4 wherein adjacent turns of the coil are connected together by capacitors so that sections of the outer conductor form loop antennas which are capacitively or inductively coupled to the coil.

14. Apparatus as claimed in claim 3 wherein said antenna means further includes parasitic antennas which receive their energy from said discrete antennas.

15. Apparatus as claimed in claim 2 wherein the coil comprises two or more coaxial cables with their outer shields joined together, thus forming parallel paths for ESR signals with different amplitudes.

* * * * *